United States Patent
Zhang

(10) Patent No.: US 9,214,966 B2
(45) Date of Patent: Dec. 15, 2015

(54) METHOD AND APPARATUS FOR CONTROLLING POWER CONSUMPTION OF TURBO DECODER

(71) Applicant: Huawei Technologies Co., Ltd., Shenzhen, Guangdong (CN)

(72) Inventor: Jiaji Zhang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 305 days.

(21) Appl. No.: 13/930,839

(22) Filed: Jun. 28, 2013

(65) Prior Publication Data

US 2014/0007108 A1 Jan. 2, 2014

(30) Foreign Application Priority Data

Jun. 29, 2012 (CN) .......................... 2012 1 0222818

(51) Int. Cl.
*G06F 11/08* (2006.01)
*H03M 13/29* (2006.01)
*H03M 13/00* (2006.01)

(52) U.S. Cl.
CPC ........... *H03M 13/2957* (2013.01); *G06F 11/08* (2013.01); *H03M 13/2975* (2013.01); *H03M 13/6502* (2013.01)

(58) Field of Classification Search
CPC ..................... H03M 13/2957; H03M 13/6502; G06F 1/32; G06F 11/08
See application file for complete search history.

(56) References Cited

U.S. PATENT DOCUMENTS

| 6,885,710 B1 | 4/2005 | Park et al. |
| 2002/0194555 A1 | 12/2002 | Gueguen |
| 2010/0272011 A1* | 10/2010 | Palanki et al. ............... 370/328 |
| 2013/0262953 A1* | 10/2013 | Deng et al. .................. 714/752 |

FOREIGN PATENT DOCUMENTS

| CN | 1263649 A | 8/2000 |
| CN | 1375948 A | 10/2002 |
| CN | 1913368 A | 2/2007 |

OTHER PUBLICATIONS

"3GPP TS 25. 212—3$^{rd}$ Generation Partnership Project; Technical Specification Group Radio Access Network; Multiplexing and channel coding (FDD) (Release 10)," Mar. 2012, Version 10.2.0, 3$^{rd}$ Generation Partnership Project, Valbonne, France.

* cited by examiner

*Primary Examiner* — Albert Wang
(74) *Attorney, Agent, or Firm* — Leydig, Voit & Mayer, Ltd.

(57) ABSTRACT

Embodiments of the present invention disclose a method and an apparatus for controlling power consumption of a TURBO decoder, which relate to the field of wireless communications technologies, can control a peak operation amount of the TURBO decoder to be within a certain range, and avoid occurrence of greater peak power consumption during a work process of the TURBO decoder, thereby lowering the manufacturing cost of a device using the TURBO decoder. The method of the present invention includes: determining size of a transmission block; determining, according to the size of the transmission block, the number of iteration times required for the TURBO decoder to process the transmission block, so as to control an operation amount required for the TURBO decoder to process the transmission block. The present invention is applicable to the TURBO decoder.

12 Claims, 2 Drawing Sheets

METHOD AND APPARATUS FOR CONTROLLING POWER CONSUMPTION OF TURBO DECODER

CROSS-REFERENCE TO RELATED APPLICATIONS

This application claims priority to Chinese Patent Application No. 201210222818.9, filed on Jun. 29, 2012, which is hereby incorporated by reference in its entirety.

TECHNICAL FIELD

The present invention relates to the field of wireless communications technologies, and in particular, to a method and an apparatus for controlling power consumption of a TURBO decoder.

BACKGROUND

A TURBO decoder has been applied widely in many wireless communications devices. As wireless communications technologies develop and a data transmission rate increases continuously, a peak operation amount of the TURBO decoder is increasing continuously, thereby increasing power consumption of the TURBO decoder.

However, when peak power consumption is excessively great, manufacturing requirements for a hardware device using the TURBO decoder are higher, for example, to cope with greater peak power consumption, a complex circuit or design structure should be used in a power chip, so that the power chip can bear the greater peak power consumption. However, the more complex the circuit or the design structure is, the higher manufacturing and design costs are, which will increase the manufacturing cost of the device.

SUMMARY

Embodiments of the present invention provide a method and an apparatus for controlling power consumption of a TURBO decoder, which can control a peak operation amount of the TURBO decoder to be within a certain range, and avoid occurrence of greater peak power consumption during a work process of the TURBO decoder, thereby lowering the manufacturing cost of a device using the TURBO decoder.

To achieve the foregoing objectives, the embodiments of the present invention adopt the following technical solutions.

In one aspect, an embodiment of the present invention provides a method for controlling power consumption of a TURBO decoder, including:
  determining size of a transmission block; and
  determining, according to the size of the transmission block, the number of iteration times required for the TURBO decoder to process the transmission block, so as to control an operation amount required for the TURBO decoder to process the transmission block.

In another aspect, an embodiment of the present invention provides an apparatus for controlling power consumption of a TURBO decoder, including:
  a transmission block size calculation module, configured to determine size of a transmission block; and
  a processing module, configured to determine, according to the size of the transmission block, the number of iteration times required for the TURBO decoder to process the transmission block, so as to control an operation amount required for the TURBO decoder to process the transmission block.

In the method and the apparatus for controlling power consumption of a TURBO decoder according to the embodiments of the present invention, the number of iteration times required for the TURBO decoder to process the transmission block can be determined according to the size of the transmission block, thereby ensuring that an actual operation amount required for the TURBO decoder to process the transmission block is not greater than a preset value of a operation amount, so that a peak operation amount when the TURBO decoder actually works is limited below the preset value of the operation amount, that is, peak power consumption when the TURBO decoder works is limited to a certain range. Compared with the prior art, the present invention can control the peak operation amount of the TURBO decoder to be within a certain range, and avoid occurrence of greater peak power consumption during a work process of the TURBO decoder, thereby lowering the manufacturing cost of a device using the TURBO decoder.

BRIEF DESCRIPTION OF DRAWINGS

To describe the technical solutions in the embodiments of the present invention more clearly, the following briefly introduces the accompanying drawings required for describing the embodiments of the present invention. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

To make the advantages of the technical solutions of the present invention more comprehensible, the following describes the present invention in detail with reference to the accompanying drawings and the embodiments.

Embodiment 1

Figure 1:
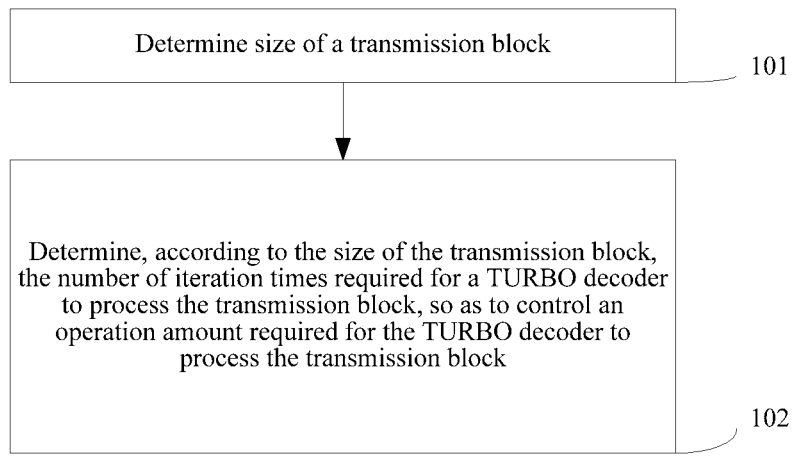
FIG. 1 is a flowchart of a method for controlling power consumption of a TURBO decoder according to Embodiment 1 of the present invention.

An embodiment of the present invention provides a method for controlling power consumption of a TURBO decoder, as shown in FIG. 1, including:
  Step 101: Determine size of a transmission block.
  Step 102: Determine, according to the size of the transmission block, the number of iteration times required for the TURBO decoder to process the transmission block, so as to control an operation amount required for the TURBO decoder to process the transmission block.

Specifically, in this embodiment, the TURBO decoder may determine a preset value of an operation amount. The preset value of the operation amount may be set automatically by the TURBO decoder according to a specific environment or may be preset by a technical person, and the preset value of the operation amount remains unchanged in a process that the TURBO decoder performs decoding on a data packet, for example, for an HSPA (High-Speed Packet Access, high-speed packet access) channel in 3GPP, the preset value of the operation amount may be 160000, and during a process that the TURBO decoder performs the decoding, the preset value of the operation amount remains to be 160000 all the time.

In actual application of the TURBO decoder, the operation amount of the TURBO decoder is in direct proportion to the number of iteration times of a transmission block currently processed by the TURBO decoder. That is, in a process that the TURBO decoder performs decoding on the current transmission block, the greater the number of iteration times is, the larger the operation amount of the TURBO decoder is, and therefore, the greater the peak power consumption of the TURBO decoder is. Further, when the preset value of the operation amount is set to a fixed value, the foregoing proportional relationship is that: the number of iteration times of the transmission block currently processed by the TURBO decoder is in inverse proportion to size of the transmission block. Before processing a data block, the TURBO decoder may firstly determine the number of iteration times of the transmission block according to size of the data block, for example, a smaller number of iteration times may be determined according to a larger transmission block, and on the contrary, a greater number of iteration times may be determined according to a smaller transmission block; and makes an actual operation amount, required when the TURBO decoder processes the transmission block, smaller than the determined preset value of the operation amount. In a similar way, for each transmission block, through the foregoing method, the TURBO decoder can make an actual operation amount, required at the time of processing each transmission block, smaller than the preset value of the operation amount, thereby controlling a peak operation amount of the TURBO decoder to be within a certain range, and avoiding occurrence of greater peak power consumption during a work process of the TURBO decoder.

In the method for controlling power consumption of a TURBO decoder according to this embodiment, the number of iteration times required for the TURBO decoder to process the transmission block can be determined according to the size of the transmission block, thereby ensuring that an actual operation amount required for the TURBO decoder to process the transmission block is not greater than a preset value of an operation amount, so that a peak operation amount when the TURBO decoder actually works is limited below the preset value of the operation amount, that is, peak power consumption when the TURBO decoder works is limited to a certain range. Compared with the prior art, the present invention can control the peak operation amount of the TURBO decoder to be within a certain range, and avoid occurrence of greater peak power consumption during a work process of the TURBO decoder, thereby lowering the manufacturing cost of a device using the TURBO decoder.

Embodiment 2

Figure 2:
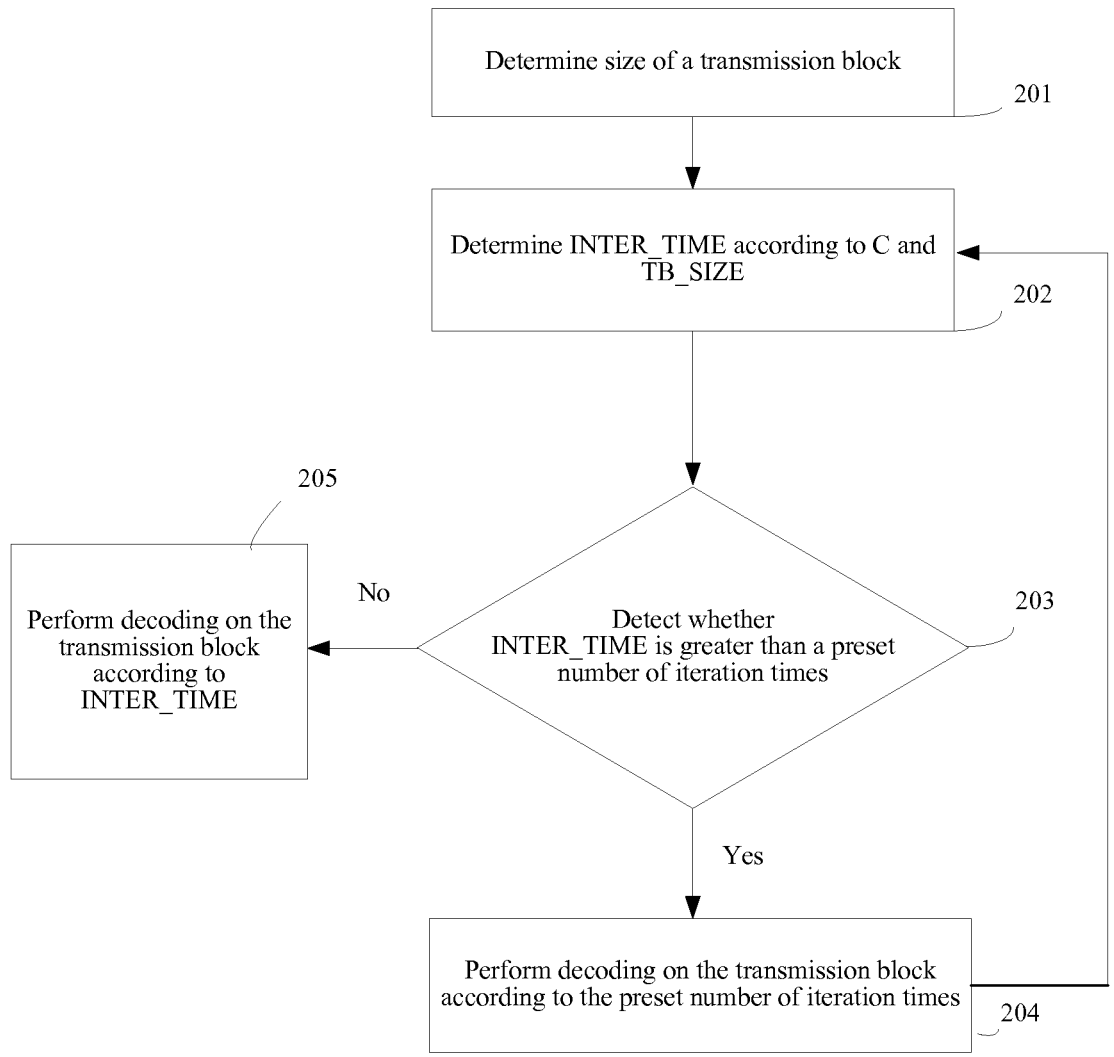
FIG. 2 is a flowchart of a method for controlling power consumption of a TURBO decoder according to Embodiment 2 of the present invention.

An embodiment of the present invention provides a method for controlling power consumption of a TURBO decoder, as shown in FIG. 2, including:

Step 201: Determine size of a transmission block.

In actual application of the TURBO decoder, an operation amount of the TURBO decoder is in direct proportion to both the size of the transmission block currently processed by the TURBO decoder and the number of iteration times required when the TURBO decoder processes the transmission block.

Further, a relationship among the operation amount required for the TURBO decoder to process the transmission block, the size of the transmission block, and the number of iteration times required for processing the transmission block is:

C≥TB_SIZE*INTER_TIME, where C is a preset value of the operation amount, TB_SIZE is the size of the transmission block, and INTER_TIME is the number of iteration times required for the TURBO decoder to process the transmission block.

For each processed transmission block, the TURBO decoder may execute the following steps:

Step 202: Determine INTER_TIME according to C and TB_SIZE.

INTER_TIME is equal to a rounded down result of C/TB_SIZE.

For example, the TURBO decoder detects that TB_SIZE=40000, greater than a preset number of iteration times being 20000, and C=160000, then INTER_TIME=C/TB_SIZE=4, that is, the number of iteration times of the transmission block currently to be processed by the TURBO decoder is 4.

Specifically, in this embodiment, because the operation amount of the TURBO decoder is in direct proportion both the size of the transmission block currently processed by the TURBO decoder and the number of iteration times required when the TURBO decoder processes the transmission block, after C is acquired and because C is a fixed value, TB_SIZE is in inverse proportion to INTER_TIME, that is, the larger the transmission block currently processed by the TURBO decoder is, the smaller the iteration times required when the TURBO decoder processes the transmission block is.

Step 203: Detect whether INTER_TIME is greater than the preset number of iteration times.

Specifically, in actual application of an existing TURBO decoder, the number of general iteration times of the TURBO decoder has a certain upper limit, so when the TURBO decoder processes a smaller data block, a peak operation amount does not occur, for example:

for an HSPA channel, the size of the largest transmission block is TB_MAX=42192. No matter how large a transmission block is, the number of iteration times when the TURBO decoder processes the transmission block does not exceed 8. When the size of the transmission block is smaller than 20000 (the preset iteration times), and because 20000*8=160000, theoretically, the maximum number of iteration times exceeds 8, and then the iteration times needs to be limited within 8.

Step 204: If INTER_TIME is greater than the preset number of iteration times, perform decoding on the transmission block according to the preset number of iteration times.

For example, after acquiring that the number of iteration times of the transmission block (TB_SIZE 32 40000) currently to be processed is 4, the TURBO decoder performs iteration for 4 times in a process of processing the transmission block, so that the operation amount when the TURBO decoder processes the transmission block is not greater than 160000, and greater power consumption does not occur when the TURBO decoder processes the transmission block.

Step 205: If INTER_TIME is not greater than the preset number of iteration times, perform the decoding on the transmission block according to INTER_TIME.

Further, within specified time, the TURBO decoder can execute a procedure of step 202 to step 205 for each transmission block required to be processed, so that the peak operation amount of the TURBO decoder within the specified time is not greater than the preset value of the operation amount, thereby avoiding occurrence of greater peak power consumption in the TURBO decoder within the specified time.

In the method for controlling power consumption of a TURBO decoder according to this embodiment, the number of iteration times required for the TURBO decoder to process the transmission block can be determined according to the size of the transmission block, thereby ensuring that the actual operation amount required for the TURBO decoder to process the transmission block is not greater than a preset value of the operation amount, so that a peak operation amount when the TURBO decoder actually works is limited below the preset value of the operation amount, that is, peak power consumption when the TURBO decoder works is limited to a certain range. Compared with the prior art, the present invention can control the peak operation amount of the TURBO decoder to be within a certain range, and avoid occurrence of greater peak power consumption during a work process of the TURBO decoder, thereby lowering the manufacturing cost of a device using the TURBO decoder.

Embodiment 3

Figure 3:
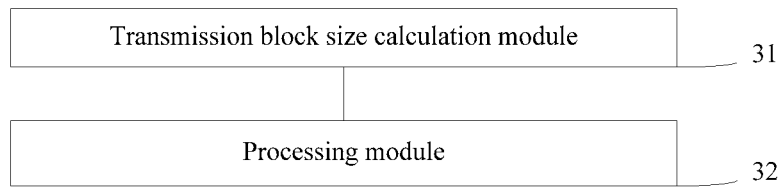
FIG. 3 is a schematic structural diagram of an apparatus for controlling power consumption of a TURBO decoder according to Embodiment 3 of the present invention.

An embodiment of the present invention provides an apparatus for controlling power consumption of a TURBO decoder, as shown in FIG. 3, including:
 a transmission block size calculation module 31, configured to determine size of a transmission block; and
 a processing module 32, configured to determine, according to the size of the transmission block, the number of iteration times required for the TURBO decoder to process the transmission block, so as to control an operation amount required for the TURBO decoder to process the transmission block.

In the apparatus for controlling power consumption of a TURBO decoder according to this embodiment, the size of the transmission block can be determined by the transmission block size calculation module, and the number of iteration times required for the TURBO decoder to process each transmission block can be determined by the processing module, thereby ensuring that the actual operation amount required for the TURBO decoder to process the transmission block is not greater than the preset value of the operation amount, so that the peak operation amount when the TURBO decoder actually works is limited below the preset value of the operation amount, that is, peak power consumption when the TURBO decoder works is limited to a certain range. Compared with the prior art, the present invention can control the peak operation amount of the TURBO decoder to be within a certain range, and avoid occurrence of greater peak power consumption during a work process of the TURBO decoder, thereby lowering the manufacturing cost of a device using the TURBO decoder.

Embodiment 4

Figure 4:
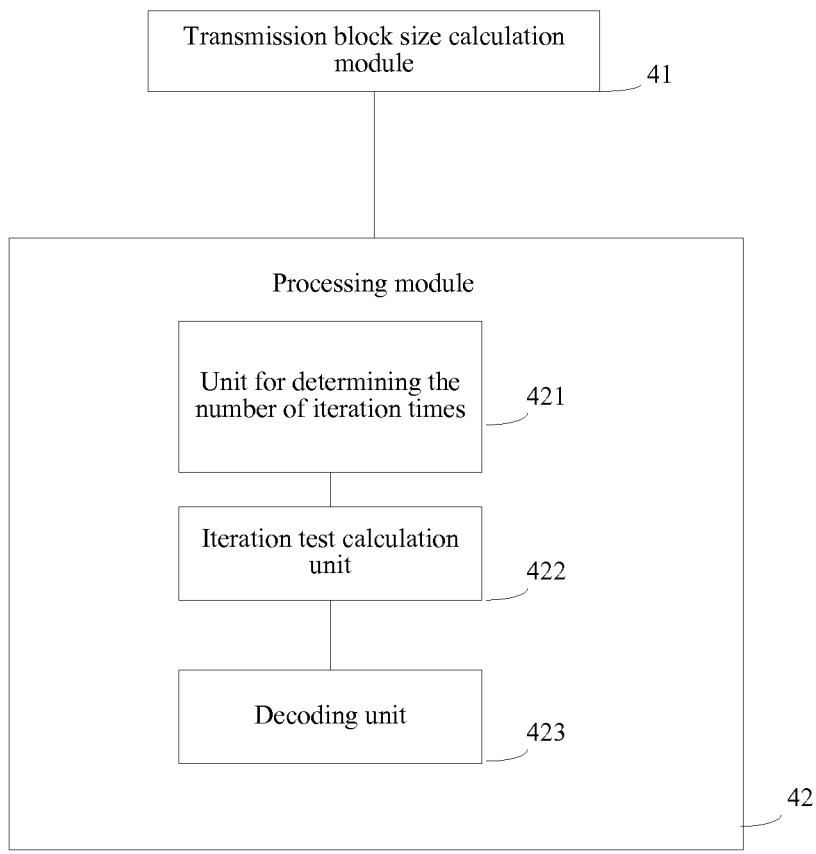
FIG. 4 is a schematic structural diagram of an apparatus for controlling power consumption of a TURBO decoder according to Embodiment 4 of the present invention.

An embodiment of the present invention provides an apparatus for controlling power consumption of a TURBO decoder, as shown in FIG. 4, including:
 a transmission block size calculation module 41, configured to determine size of a transmission block; and
 a processing module 42, configured to determine, according to the size of the transmission block, the number of iteration times required for the TURBO decoder to process the transmission block, so as to control an operation amount required for the TURBO decoder to process the transmission block.

A relationship among the operation amount required for the TURBO decoder to process the transmission block, the size of the transmission block and the number of iteration times required for processing the transmission block is:
 $C \geq TB\_SIZE * INTER\_TIME$, where C is a preset value of the operation amount, TB_SIZE is the size of the transmission block, and INTER_TIME is the number of iteration times required for the TURBO decoder to process the transmission block.

Further, the processing module 42 includes:
 a unit for determining the number of iteration times 421, configured to determine INTER_TIME according to C and TB_SIZE;
 where INTER_TIME is equal to a rounded down result of C/TB_SIZE;
 an iteration test calculation unit 422, configured to detect whether INTER_TIME is greater than a preset number of iteration times; and
 a decoding unit 423, configured to: if INTER_TIME is greater than the preset number of iteration times, perform decoding on the transmission block according to the preset number of iteration times.

The decoding unit 423 is further configured to: if INTER_TIME is not greater than the preset number of iteration times, perform the decoding on the transmission block according to INTER_TIME.

Further, the decoding unit 423 is further configured to perform the decoding on each transmission block in sequence, where the number of iteration times which one transmission block is decoded according to is the number of iteration times required for the TURBO decoder to process the transmission block and determined by the processing module, so as to control a peak operation amount of the TURBO decoder within specified time.

The processing module 42 is further configured to determine, within the specified time and in sequence, the number of iteration times required for the TURBO decoder to process each transmission block.

The number of iteration times which one transmission block is decoded according to is the number of iteration times required for the TURBO decoder to process the transmission block and determined by the processing module.

In the apparatus for controlling power consumption of a TURBO decoder according to this embodiment, the size of the transmission block can be determined by the transmission block size calculation module, and the number of iteration times required for the TURBO decoder to process each transmission block can be determined by the processing module, thereby ensuring that the actual operation amount required for the TURBO decoder to process the transmission block is not greater than the preset value of the operation amount, so that the peak operation amount when the TURBO decoder actually works is limited below the preset value of the operation amount, that is, peak power consumption when the TURBO decoder works is limited to a certain range. Compared with the prior art, the present invention can control the peak operation amount of the TURBO decoder to be within a certain range, and avoid occurrence of greater peak power consumption during a work process of the TURBO decoder, thereby lowering the manufacturing cost of a device using the TURBO decoder.

Each embodiment in the specification is described in a progressive manner. The same or similar parts in the embodiments are just references to each other. Every embodiment illustrates in emphasis what is different from the other embodiments. In particular, for the apparatus embodiment, because it is basically similar to the method embodiment, the apparatus embodiment is described simply, and the related parts may be obtained with reference to the part of the description of the method embodiment.

Person of ordinary skill in the art may understand that all or part of the procedures of the methods in the embodiments may be implemented by a computer program instructing relevant hardware. The program may be stored in a computer readable storage medium. When the program is run, the processes of the methods in the embodiments are performed. The storage medium may be a magnetic disk, an optical disk, a read-only memory (Read-Only Memory, ROM), a random access memory (Random Access Memory, RAM) or the like.

The foregoing descriptions are merely specific embodiments of the present invention, but are not intended to limit the protection scope of the present invention. Any variation or replacement readily figured out by persons skilled in the art within the technical scope of the present invention shall fall within the protection scope of the present invention. Therefore, the protection scope of the present invention shall be subject to the protection scope of the claims.

What is claimed is:

1. A method for controlling power consumption of a TURBO decoder, comprising;
   determining a size of a transmission block; and
   determining, according to the size of the transmission block, the number of iterations required for the TURBO decoder to process the transmission block, so as to control an operation amount required for the TURBO decoder to process the transmission block;
   wherein a relationship between the operation amount required for the TURBO decoder to process the transmission block, the size of the transmission block and the number of iterations required for processing the transmission block is: C≥TB_SIZE*INTER_TIME, wherein C is a preset value of the operation amount, TB_SIZE is the size of the transmission block, and INTER_TIME is the number of iterations required for the TURBO decoder to process the transmission block, and
   wherein the determining, according to the size of the transmission block, the number of iterations required for the TURBO decoder to process the transmission block comprises determining INTER_TIME according to C and TB_SIZE, wherein INTER_TIME is equal to a rounded-down result of C/TB_SIZE.

2. The method for controlling power consumption of a TURBO decoder according to claim 1, wherein after the determining INTER_TIME according to C and TB_SIZE, the method further comprises:
   detecting whether INTER_TIME is greater than a preset number of iterations;
   if INTER_TIME is greater than the preset number of iterations, performing decoding on the transmission block according to the preset number of iterations.

3. The method for controlling power consumption of a TURBO decoder according to claim 2, wherein if INTER_TIME is not greater than the preset number of iteration times, the decoding is performed on the transmission block according to INTER_TIME.

4. The method for controlling power consumption of a TURBO decoder according to claim 3, comprising:
   determining, within a specified time and in sequence, the number of iterations required for the TURBO decoder to process each transmission block, and performing decoding on each transmission block in sequence so as to control a peak operation amount of the TURBO decoder within the specified time, wherein the number of iterations in which one transmission block is decoded is the determined number of iterations required for the TURBO decoder to process the transmission block.

5. The method for controlling power consumption of a TURBO decoder according to claim 2, comprising:
   determining, within a specified time and in sequence, the number of iterations required for the TURBO decoder to process each transmission block, and performing decoding on each transmission block in sequence so as to control a peak operation amount of the TURBO decoder within the specified time, wherein the number of iterations in which one transmission block is decoded is the determined number of iterations required for the TURBO decoder to process the transmission block.

6. A method for controlling power consumption of a TURBO decoder, comprising:
   determining a size of a first transmission block;
   determining, according to the size of the first transmission block, the number of iterations required for the TURBO decoder to process the first transmission block, so as to control an operation amount required for the TURBO decoder to process the first transmission block; and
   determining, within a specified time and in a sequence, the number of iterations required for the TURBO decoder to process each of one or more additional transmission blocks, and performing decoding on each of one or more additional transmission blocks in sequence so as to control a peak operation amount of the TURBO decoder within the specified time, wherein the number of iterations in which one transmission block is decoded is the determined number of iterations required for the TURBO decoder to process the first transmission block.

7. An apparatus for controlling power consumption of a TURBO decoder, comprising:
   a transmission block size calculation module, configured to determine size of a transmission block; and
   a processing module, configured to determine, according to the size of the transmission block, a number of iterations required for the TURBO decoder to process the transmission block, so as to control an operation amount required for the TURBO decoder to process the transmission block,
   wherein a relationship among the operation amount required for the TURBO decoder to process the transmission block, the size of the transmission block, and the number of iterations required for processing the transmission block is: C≥TB_SIZE*INTER_TIME, wherein C is a preset value of the operation amount, TB_SIZE is the size of the transmission block, and INTER_TIME is the number of iterations required for the TURBO decoder to process the transmission block, and
   wherein the processing module comprises_a unit for determining the number of iterations, configured to determine INTER_TIME according to C and TB_SIZE, wherein INTER_TIME is equal to a rounded down result of C/TB_SIZE.

8. The apparatus for controlling power consumption of a TURBO decoder according to claim 7, wherein the processing module further comprises:
- an iteration test calculation unit, configured to detect whether INTER_TIME is greater than a preset number of iterations; and
- a decoding unit, configured to: perform decoding on the transmission block according to the preset number of iterations if INTER_TIME is greater than the preset number of iteration times.

9. The apparatus for controlling power consumption of a TURBO decoder according to claim 8, wherein:
- the processing module is further configured to determine, within a specified time and in sequence, the number of iterations required for the TURBO decoder to process each transmission block; and
- the decoding unit is further configured to perform decoding on each transmission block in sequence so as to control a peak operation amount of the TURBO decoder within the specified time, wherein the number of iterations in which one transmission block is decoded is determined by the processing module to be the number of iterations required for the TURBO decoder to process the transmission block.

10. The apparatus for controlling power consumption of a TURBO decoder according to claim 7, wherein the decoding unit is further configured to: if INTER_TIME is not greater than a preset number of iterations, perform decoding on the transmission block according to INTER_TIME.

11. The apparatus for controlling power consumption of a TURBO decoder according to claim 10, wherein:
- the processing module is further configured to determine, within a specified time and in sequence, the number of iterations required for the TURBO decoder to process each transmission block; and
- the decoding unit is further configured to perform decoding on each transmission block in sequence so as to control a peak operation amount of the TURBO decoder within the specified time, wherein the number of iterations in which one transmission block is decoded is determined by the processing module to be the number of iteration times required for the TURBO decoder to process the transmission block.

12. An apparatus for controlling power consumption of a TURBO decoder, comprising:
- a transmission block size calculation module, configured to determine size of a first transmission block; and
- a processing module, configured to determine, according to the size of the first transmission block, a number of iterations required for the TURBO decoder to process the first transmission block, so as to control an operation amount required for the TURBO decoder to process the first transmission block,
- wherein the processing module is further configured to determine, within a specified time and in sequence, the number of iterations required for the TURBO decoder to process each of one or more additional transmission blocks; and
- wherein the processing module comprises a decoding unit configured to perform decoding on each of the one or more additional transmission blocks in sequence so as to control a peak operation amount of the TURBO decoder within the specified time, wherein the number of iterations in which one transmission block is decoded is determined by the processing module to be the number of iterations required for the TURBO decoder to process the first transmission block.

* * * * *